United States Patent [19]

Odashima et al.

[11] Patent Number: 4,620,663
[45] Date of Patent: Nov. 4, 1986

[54] PARTS-CONNECTING APPARATUS USING SOLDER

[75] Inventors: Hitoshi Odashima, Yokohama; Hideaki Sasaki; Shinichi Kazui, both of Hadano; Shigeo Shiono; Osamu Isshiki, both of Hitachi; Takeshi Kawana, Yokohama, all of Japan

[73] Assignee: Hitachi, Ltd., Tokyo, Japan

[21] Appl. No.: 702,740

[22] Filed: Feb. 19, 1985

[30] Foreign Application Priority Data

Feb. 29, 1984 [JP] Japan ................... 59-36022

[51] Int. Cl.[4] .................. B23K 37/04; B23K 31/02
[52] U.S. Cl. ................... 228/44.7; 228/49.1; 219/121 LC; 219/85 BA; 219/158; 219/161
[58] Field of Search ............... 228/180.2, 44.7, 49.1; 219/121 LC, 121 LD, 85 BA, 85 BM, 161, 158

[56] References Cited

U.S. PATENT DOCUMENTS

| | | | |
|---|---|---|---|
| 3,517,155 | 6/1970 | Mantel et al. | 219/73 R |
| 3,855,693 | 12/1974 | Umbaugh | 228/180.2 |
| 3,937,386 | 2/1976 | Hartleroad et al. | 228/6.2 |
| 4,278,867 | 7/1981 | Tan | 219/121 LC |
| 4,404,741 | 9/1983 | Lebet et al. | 228/49.1 |

Primary Examiner—Nicholas P. Godici
Assistant Examiner—Samuel M. Heinrich
Attorney, Agent, or Firm—Antonelli, Terry & Wands

[57] ABSTRACT

An apparatus for connecting wiring patterns on a wiring board and leads of a parts to be mounted on the wiring board, via the solder provided between the leads and the patterns. The parts-connecting apparatus enables, especially, circuit elements of a high degree of, to be connected automatically with high reliability and accuracy by using solder through the steps of setting the wiring board in a predetermined position while pressing a surface thereof so as to remove the warp from the wiring board, fastening the leads of the part to the wiring patterns by a magnet provided on the lower surface of the wiring board, and heating the solder provided on the portions of the leads which are fastened to the wiring patterns.

5 Claims, 26 Drawing Figures

PARTS-CONNECTING APPARATUS USING SOLDER

BACKGROUND OF THE INVENTION

This invention relates to an electronic parts-connecting appratus for connecting a printed wiring board for example, electronic parts together with the apparatus including, for example, a means for placing a lead of the electronic part on a wiring pattern via solder, and thereafter melting the solder thermally so as to connect the wiring board and the part together.

While parts-connection apparatus using solder have been proposed, in the proposed appartus generally, due to a number of factors such as, for example, a warped portion of the wiring board, the rate of heating of the solder depends upon a position on the wiring board and, consequently, the solder is melted insufficiently, or overheated to cause the wiring board 10 and the lead of the electronic part to be burnt, in some cases. Moreover, in the proposed apparatus, when a part having a plurality of leads, such as an integrated circuit element (IC element) is placed on a wiring board, the distances between the leads and the surface of the wiring board vary, i.e. are not in a constant level. Additionally, the contacting condition of flat portions of leads and the solder provided on a wiring board varies in some cases due to the deformation of the leads. In such cases, some of the leads would not be joined to the solder. Namely, even when the solder is melted properly, the wiring pattern on the wiring board and the leads of the electronic parts are not connected in a sufficient manner in some cases. Moreover, no excellent means for eliminating these inconveniences have been available, and this problem still remains unsolved.

This invention relates to a parts-connecting apparatus using solder, which is capable of solving the problems involved in a conventional parts connecting apparatus and which is capable of, connecting parts to a wiring board with solder reliably irrespective of a warp in the wiring board, variations in the form of the wiring board including variations in the thickness thereof, and the dimensional errors and deformation of a lead of a part, and thereby improving the reliability and yield of a product.

In accordance with the present invention, means are provided for removing warp from a wiring board which is set in a predetermined position (positioned in a predetermined manner), a means which consists of a magnet provided on one side surface of the wiring board and which is adapted to attract a lead of a parts, which is provided on the other side surface of the wiring board, and thereby bring the lead into contact with the solder on the wiring board, and means for thermally melting the solder, which is in contact with the lead, so as to a wiring pattern on the wiring board and the lead of a parts together.

DETAILED DESCRIPTION:

An embodiment of the present invention will now be described.

Figure 1:
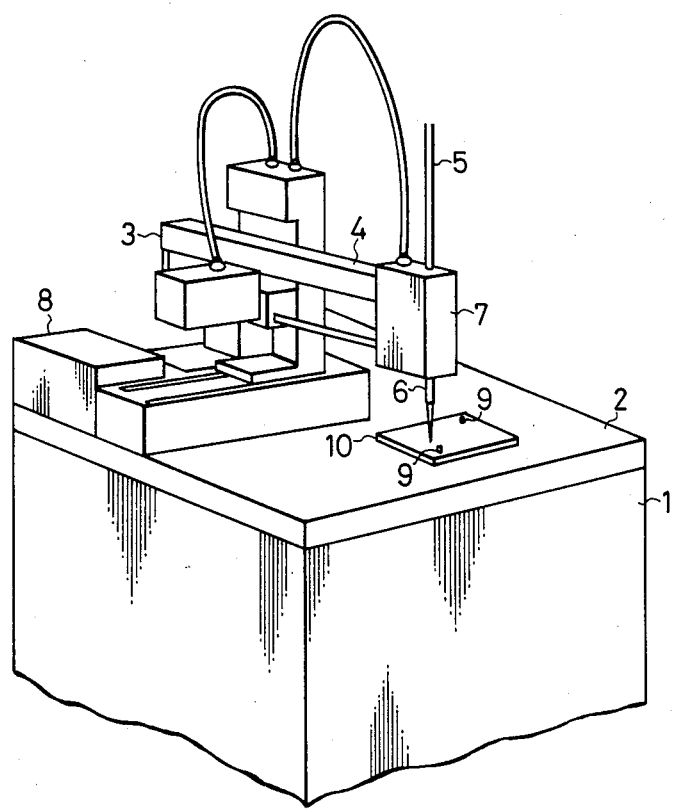
FIG. 1 is a perspective view of a conventional parts-connecting apparatus using solder.

Referring now to the drawings wherein like reference numerals are used throughout the various views to designate like parts and, more particularly, to FIG. 1, according to this figure, a conventional parts connecting apparatus using solder accommodates a wiring board 10 by positioning pins 9 on a table 10 which is fastened to a base 1. An electronic part (not shown) is placed on the wiring board 10, and a flat portion of a lead of the electronic part or parts is held on a wiring pattern of the wiring board 10 through solder. An arm 4 of a robot 3, automatically movable in a three dimensional direction, is provided with a radiation head 7 having an optical system 6, and an otpical fiber 5 is connected to the radiation head 7. The optical system 6 on the robot 3 is transferred to the position of the lead so as to be set therein. A radiation beam is then applied to the solder to melt the same and thereby connect the lead and wiring pattern together.

However, if the wiring board in such an apparatus has a warped portion, a distance between the optical system 6 and a position to which the radiation beam is applied on the wiring board varies, so that a rate of heating of the solder with the projected beam varies in dependence upon a position of the wiring board thereby resulting in, for example, insufficient melting of the solder, overheating, burning of the electronic component, insufficient joining of the leads to the solder, and insufficient contacting of flat portions of the leads and the solder on the wiring board.

Figure 2:
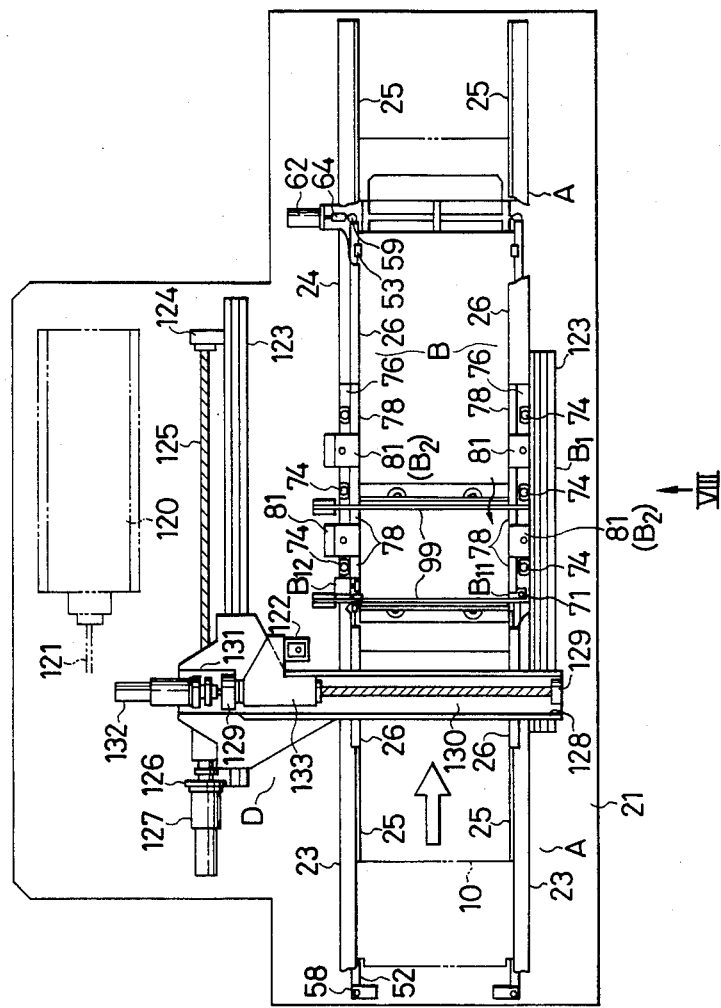
FIG. 2 is a plane view of an embodiment of the present invention.

As shown in FIG. 2, according to the present invention a wiring board 10 is supported horizontally between rails 23, 24 which are disposed on a base 21, and a transfer means A, adapted to carry the wiring board 10 by chains 52, 53, is also provided on the base 21. The wiring board 10 is carried onto the base 21 by the transfer means A and stopped in an intermediate position thereon. The wiring board 10 is discharged from the base 21 after it has been subjected to a solder-connecting operation.

In the above-mentioned intermediate position, means $B_1$ and $B_2$ (FIGS. 2, 3 and 9) are provided, with the means $B_1$ being adapted to set the wiring board 10, which is carried onto the base 21, horizontally in a predetermined position, and the means $B_2$ being adapted to clamp a peripheral portion of the wiring board 10 and position the same in the vertical direction for the purpose of maintaining the wiring board 10 in a suitable position opposed to a heating means D which will be described later, and remove warp from the wiring board 10.

Figure 3:
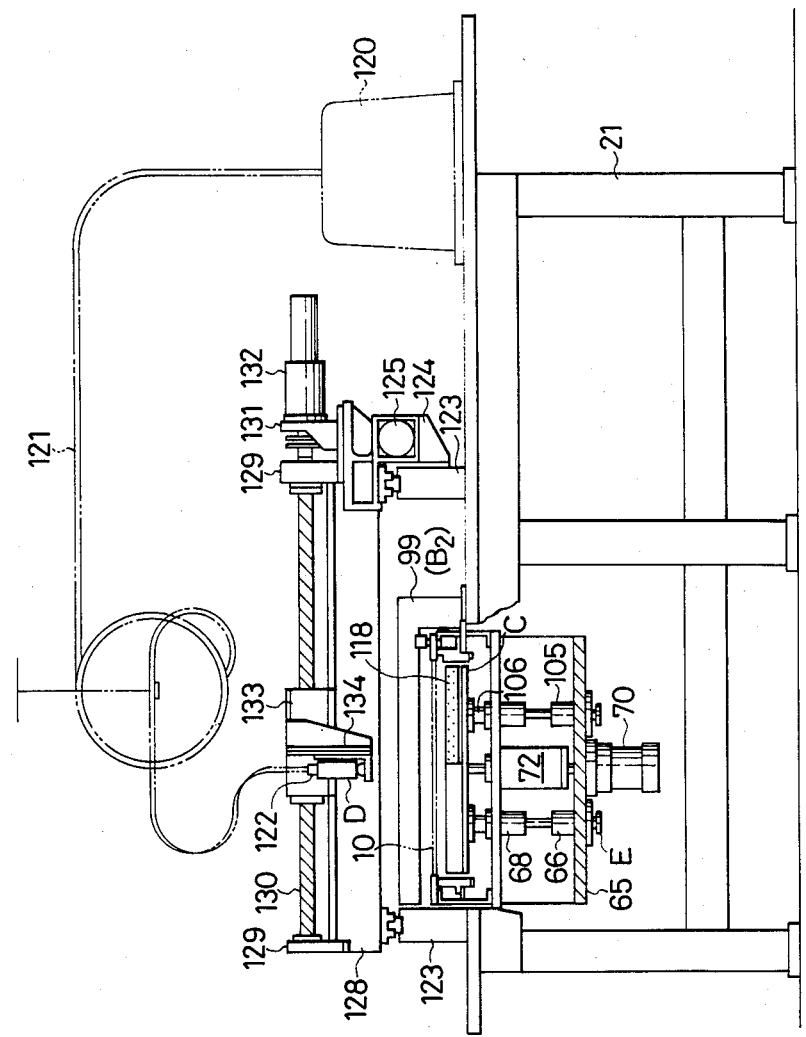
FIG. 3 is a partially sectioned front elevation of the embodiment of FIG. 2.

As shown in FIG. 3, an absorber means C adapted to engage and disengage a flat magnet 118, which is in close contact therewith, with and from the wiring board 10 in the intermediate position, and having a shock absorber mechanism E for lessening the shock occurring between the wiring board 10 and magnet 118, is provided on the lower side of the wiring board 10.

As shown in FIGS. 2 and 3, a heating means D, on which an optical system 122 for thermally melting solder is supported so that the optical system 122 can be moved freely in a thre-dimensional direction, is provided above the wiring board 10 which is opposed to the absorber means C.

Figure 10:
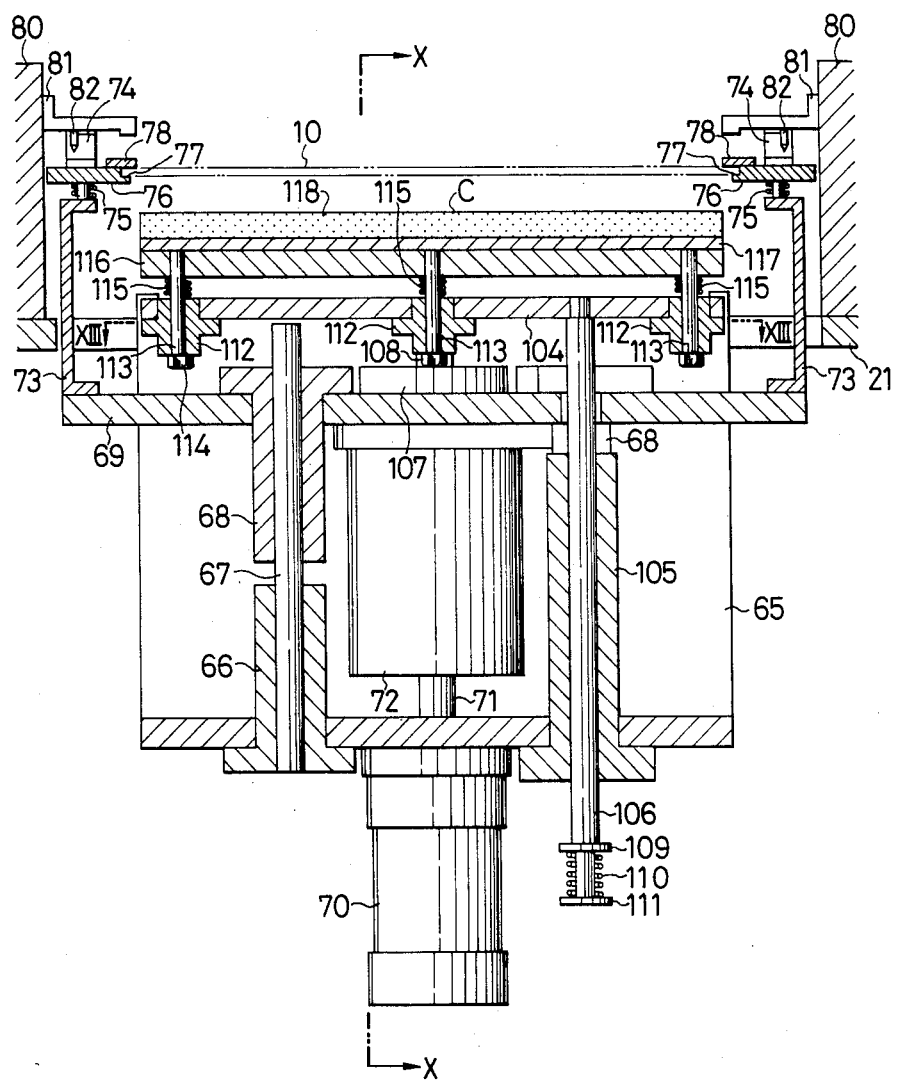
FIG. 10 is a sectional view taken along the line IX—IX in FIG. 9.

With regard to the transfer means A, as shown in FIG. 2, the rails 23, 24 are arranged in series of each other, and rails 76 for the positioning means B are provided on the intermediate portions of the rails 23, 24. The rails 23, 24; 76 are spaced from each other by a distance equal to the width of the wiring board 10, and includes a pair of opposed rails. The rails 23, 24; 76 are provided with stepped portions 25, 77 (shown in FIGS. 4, 5 and 10) for supporting edge portions of the wiring board 10. As shown in FIGS. 5 and 10, covers 26, 78 are provided above the stepped portions 25, 77 so as to prevent the wiring board from floating.

Figure 4:
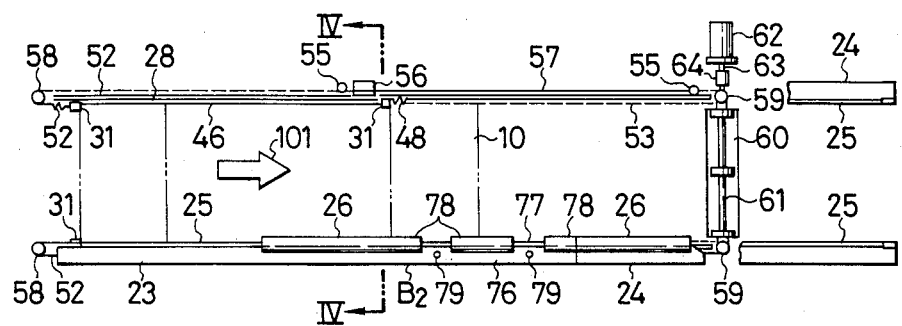
FIG. 4 is a plane view of a transfer means in the embodiment.
Figure 5:
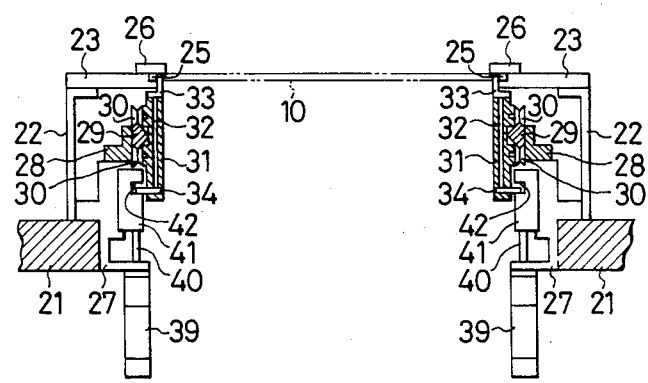
FIG. 5 is a sectional view taken along the line IV—IV in FIG. 4.
Figure 6:
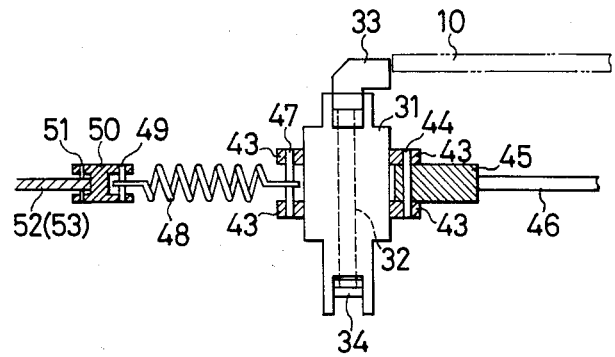
FIG. 6 is an enlarged view showing the details around a slider in the transfer means in the embodiment of FIG. 2.
Figure 7:
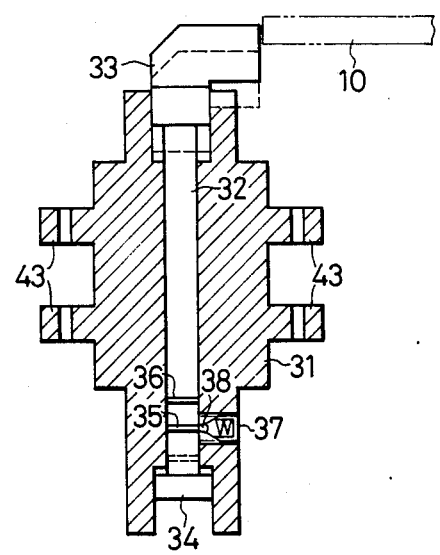
FIG. 7 is an enlarged section of the slider in the transfer means in the embodiment of FIG. 2.

As shown in FIGS. 4 and 5, the rails 23, 24 are disposed on support members 22 fixed to the base 21, and support the wiring board 10 in the above-described manner. Rails 29 are formed on the base via stands 27 and support elements 28 in such a manner that the rails 29 extend in parallel with the rails 23, 24. Sliders 31 are supported movably on the rails 29 via rollers 30 between which the rails 29 are sandwiched. As shown in FIGS. 6 and 7, a shaft 32 is inserted slidably in each slider 31. A claw 33 is joined to one end portion thereof. The claw 33 is provided in a position in which the claw 33 can engage with a moving edge portion of the wiring board.

As shown in FIG. 5, small pieces 41 are supported on predetermined portions of the stands 27 so that the small pieces 41 can be slidably moved in the vertical direction. Grooves 42 are provided in predetermined portions of the small pieces 41 in such a manner that grooves 42 extend in a transfer direction designated by the arrow 101 in FIG. 4, in which the wiring board 10 is transferred, with respect to the whole length of each small piece 41. Arms 34 are detachably engaged with the grooves 42. Rods 40 in cylinders 39 are connected to the small pieces 41. As shown in FIG. 7, each shaft 32 is provided with spaced locking grooves 35, 36, with which a ball 38 on a plunger 37 supported on the slider 31 is engaged. When the slider 31 is moved, so that the arm 34 is fitted in the groove 42 in the small piece 41, the small piece 41 moves up by an operation of the cylinder 39 to cause the claw 33 on the slider 31 to be set in a position in which the claw can engage with a moving edge portion of the wiring board 10. Accordingly, when the slider 31 is moved along the rail 29, the wiring board 10 is sent in the transfer direction 101. During this time, the ball 38 engages the locking groove 35 (see FIG. 7), and the shaft 32 is fixed. Conversely, when the slider 31 is moved back, so that the arm 34 and small piece 41 reengage to cause the cylinder 39 to lower, the claw 33 is set in a position in which the claw 33 is disengaged from the lower surface of the wiring board 10, and the ball 38 engages with the locking groove 36 to fix the shaft 32.

Figure 8:
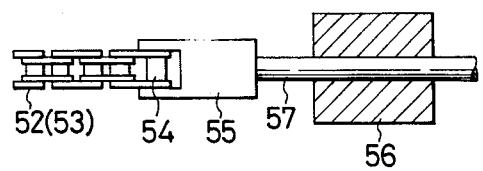
FIG. 8 is an enlarged view showing a chain in a connected state in the transfer means in the embodiment of FIG. 2.

As shown in FIG. 4, the sliders 31 are provided on the side of the rail 23 and on the side of the rail 24. The sliders 31 are connected annularly by a connecting rod 57 via a spring 48, a chain 53, a connecting piece 55, a connecting rod 57, a connecting piece 55. Sprockets 58, 59 are provided at both ends of the rails 23, 24 so as to support the chains 52, 53 wrapped therearound. As shown in FIG. 8, a bearing 56 supports the connecting rod 57 so that the connecting rod 57 can be slidably moved. The bearing 56 is fixed to the support element 28, though it is not shown clearly in the drawings.

FIG. 6 shows the details of the connecting portions of the slider 31, chain 52 and connecting rod 46. Shafts 44, 47 are supported rotatably on bearings 43 (shown in FIG. 7 as well) which are formed at both ends of the slider 31. A connecting piece 45 is rotatably supported on the shaft 44, and a connecting rod 46 is joined to the connecting piece 45. A spring 48 is engaged at one end thereof with the shaft 43, and at the other end thereof, with a pin 49 rotatably supported on a connecting piece 50. As shown in FIG. 8, the chain 52 is joined to the connecting piece 55 via a pin 54, and the connecting rod 57 to the connecting piece 55. The connecting rod 57, connecting piece and chain 53 are joined together in the same manner as described above.

As shown in FIG. 4, the sprockets 59 are connected together via a shaft 61 and a bevel gear (not shown), and the shaft 61 is joined to a rotary shaft 63 of a motor 62 via a coupling 64.

When the motor 62 is rotated, the chains 52, 53 are moved to cause the sliders 31 to be moved in the transfer direction 101. Consequently, the wiring board 10 is carried onto the base 21 and further transferred.

As shown in FIGS. 2-4 and 9-14, positioning means B is provided with a first positioning unit $B_1$ (FIG. 2) for retaining the wiring board 10 and positioning the same in the horizontal direction, and a second positioning unit $B_2$ (FIG. 4) for positioning the wiring board 10 in the vertical direction.

Figure 9:
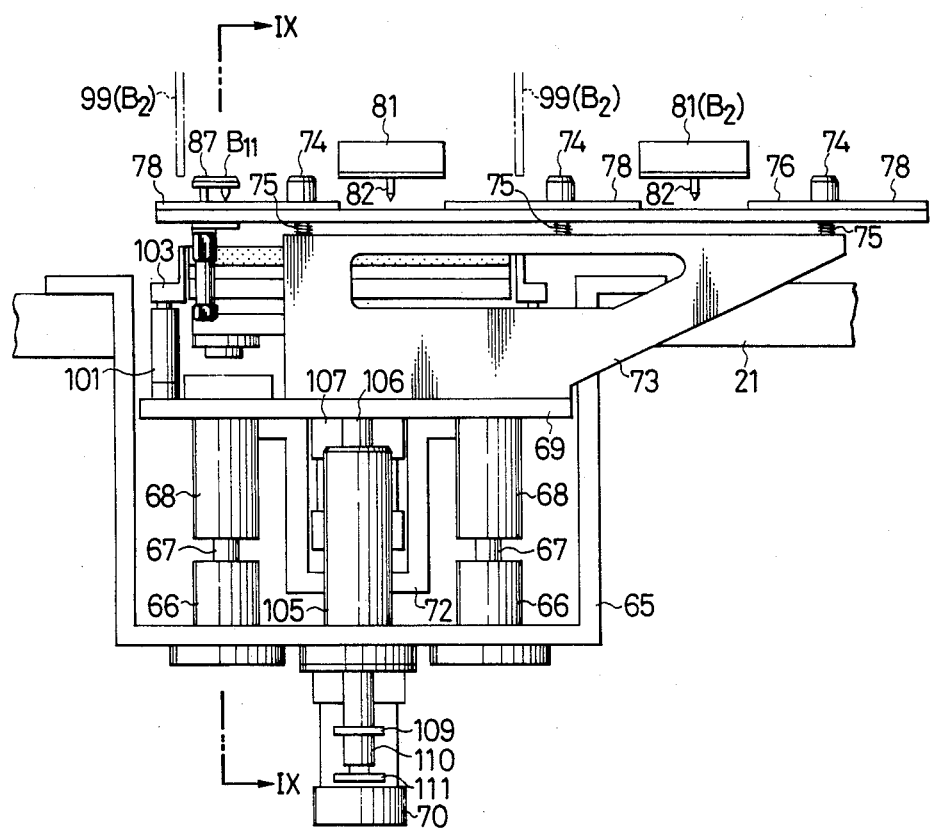
FIG. 9 is a front elevational view taken in a direction of the arrow VIII of FIGS. 2 and 14 of a positioning means and an absorber means in the embodiment of FIG. 2.
Figure 14:
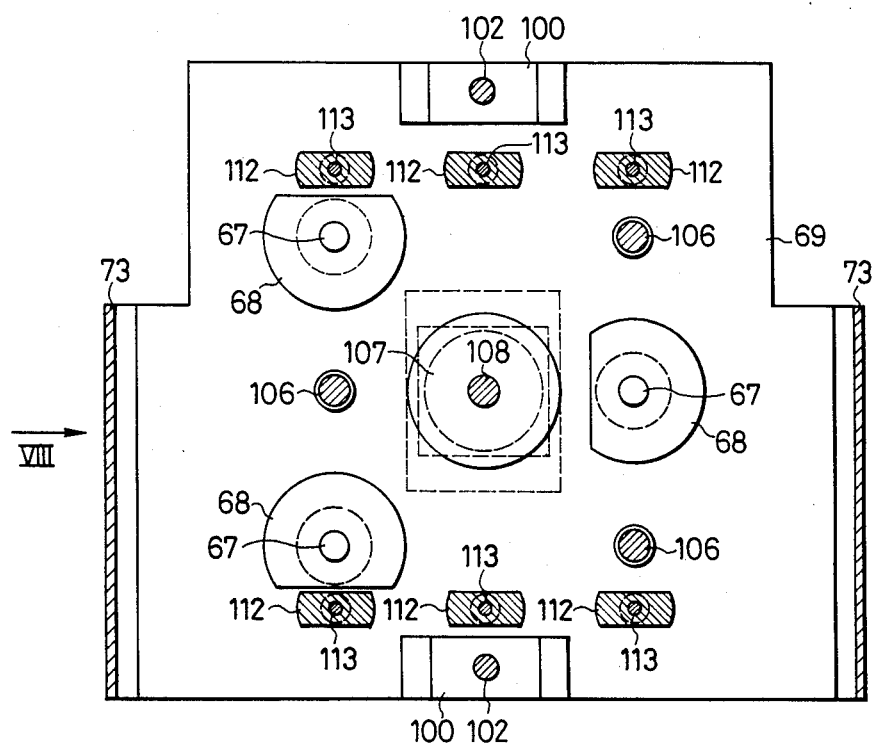
FIG. 14 is a sectional view taken along the line XIII—XIII in FIG. 10.

As shown in FIGS. 9 and 10 both edge portions of a frame 65 are fixed to the base 21. Bearings 66, on which shafts 67 which as shown in FIG. 14, may include three shafts, are supported firmly, and a cylinder 70 are fixed to a bottom wall of the frame 65. A base member 69 is provided on the opposite side, i.e., on the upper side of the bottom wall of the frame 65. Bearings 68, which are arranged in opposition to the bearings 66, and a bracket 72 are fixed to the base member 69. The shafts 67 are supported slidably on the bearings 68, and the bracket 72 is connected to the cylinder 70 by a rod 71 (shown in FIG. 10).

Figure 22:
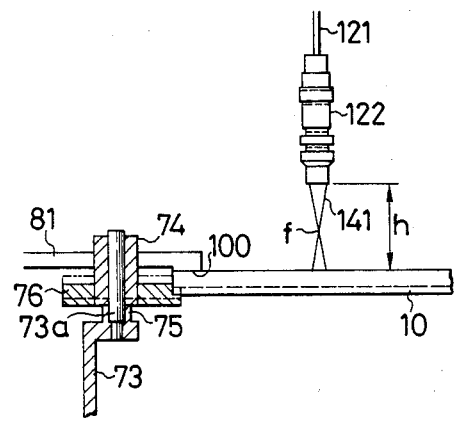
FIG. 22 illustrates a relationship between the wiring board and optical system in accordance with the present invention.

A support base 73 is fixed to the upper surface of the base member 69, and a guide pin 73a is fastened to an upper end portion of the support base 73 as shown in FIG. 22. The guide pin 73a is slidably inserted in a guide collar 74 fixed to a rail 76. A spring 75, guided by the guide pin 73a, is provided between the guide collar 74 and the support base 73.

As shown in FIG. 10, brackets 81 are fixed to blocks 80 placed on the base 21, and a guide collar 74 is slidably supported on each brcket 81 (FIG. 22). Positioning pins 82, fixed to the brackets 81, are formed in positions in which the pins 82 can be fitted in positioning bores (not shown) made in predetermined portions of the rails 76 and opposite to these positions. Each bracket 81 is provided separately from and opposite the corresponding rail 76. When a reference positioning surface at the lower side of the bracket 81 and the rail 76 contact each other, the upper surface of the rail 76 is properly positioned properly. During this time, the positioning pin 82 fits in the positioning bore, so that the rail 76 is horizontally positioned.

A primary positioning unit $B_{11}$ and an auxiliary positioning unit $B_{12}$ for positioning the wiring board 10 on the rails 76. These are disposed near the rails 23 as shown in FIG. 2.

Figure 12:
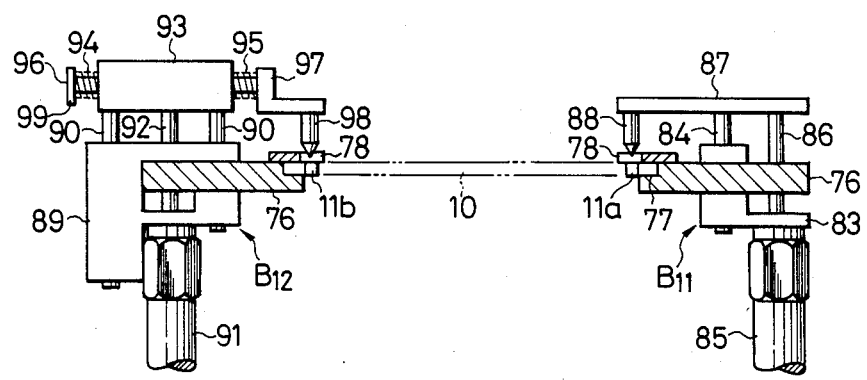
FIG. 12 illustrates a part of the positioning means of the present.

As shown in FIG. 12, a bearing 83 in the primary positioning unit $B_{11}$ is fixed to the rail 76, and a cylinder 85 to the bearing 83. A shaft 84 is slidably supported on the bearing 83, and a plate 87 is joined to an end of the shaft 84 so as to extend opposite the rail 76. A positioning pin 88, adapted to be inserted into a reference bore 11a in the wiring board 10, is supported on the plate 87. A rod 86 in the cylinder 85 is also joined to the plate 87 so as to move the same vertically. On the other hand, a bearing 89 in the auxiliary positioning unit $B_{12}$ is fixed to the rail 76, and a bearing 93 is adapted to be moved up and down along shafts 90 by a rod 92 in a cylinder 91. The shafts 90 and cylinder 91 are fixed to the bearing 89. A shaft 96 is slidably supported through the bearing 93, and a retainer 97 is fixed to one end of the shaft 96, a collar 99 being fixed to the other end thereof. Springs 95, 94 are provided between the retainer 97 and the bearing 93 and between the bearing 93 and the collar 99, respectively. A positioning pin 98, adapted to be fitted into a reference bore 11b in the wiring board 10, is supported on the retainer 97.

Figure 13:
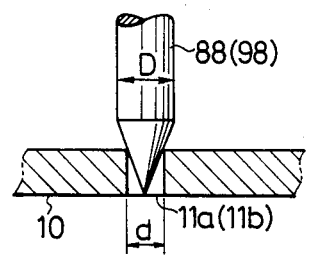
FIG. 13 is a sectional view showing the relation between the positioning means in the embodiment and the wiring board and positioning pins.

When the wiring board 10 is carried onto the rails 76 in the above arrangement, the positioning pin 88 in the primary positioning unit $B_{11}$ fits in the reference bore 11a in the wiring board 10 to position the same board 10. The positioning pin 98 is then fitted into the reference bore 11b to correct the inclination of the wiring board 10. An error in a distance between the reference bores 11a, 11b is absorbed by the sliding movement of the shaft 96. A difference between the stress in the springs 95, 94, which occurs due to the sliding movement of the shaft 96, is removed by removing the positioning pin 98 from the reference bore 11b to cause the shaft 96 to be moved to a stress-balancing position. Even when the positioning pin 98 is disengaged from the reference bore 11b after the inclination of the wiring board 10 is removed thereby, no problems occur since the wiring board 10 has already been positioned due to the engagement of the positioning pin 88 with the reference bore 11a. As shown in FIG. 13, a diameter D of the positioning pin 88 (98) is set larger than that a diamater d of the reference bore 11a (11b), and the fitting portion of the positioning pin 88 (98) is conically shaped. Accordingly, the positioning pin 88 (98) and the reference bores 11a (11b) can be engaged with each other without any gap therebetween, so that the wiring board 10 can be accurately positioned.

Due to the above-mentioned operation, the wiring board 10 is positioned accurately on the rails 76, and the rails 76 three-dimensionally with respect to the base 21 and frame 65.

Figure 11:
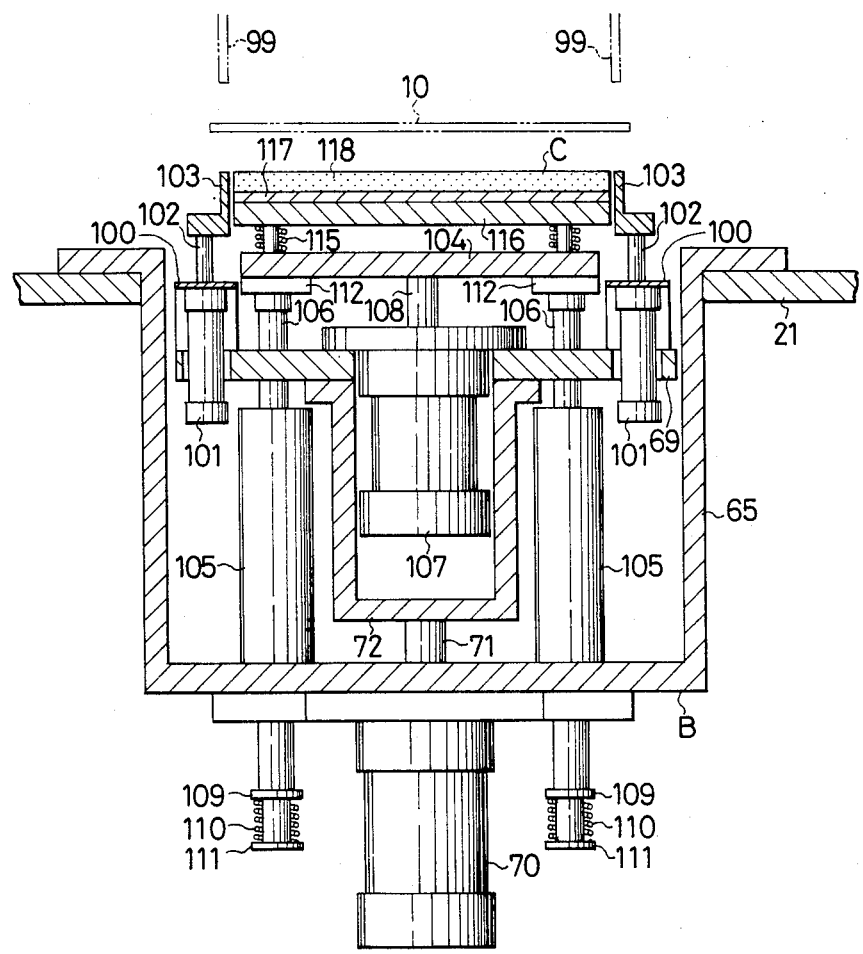
FIG. 11 is a sectional view taken along the line X—X in FIG. 10.

The second positioning unit $B_2$ is provided as shown in FIGS. 3, 9 and 11 with setting plates 99, which are positioned above the wiring board 10 set on the base 21 by the first positioning unit $B_1$, and which are fixed so as to extend at right angles to the direction in which the wiring board 10 is transferred. As shown in FIG. 9, the lower end surfaces of the setting plates 99 are set so that they have the same height as the lower surfaces of the brackets 81. As shown in FIG. 11, lift members 103 positioned in an opposed state on both sides of the wiring board 10 and extending opposite the setting plates 99 are supported on rods 102 in cylinders 101 which are supported on the base member 69 via support plates 100. Accordingly, when the cylinders 101 are actuated to raised the left members 103 and raise the wiring board 10, the wiring board 10 can be held firmly between the setting plates 99 and the left members 103. During this time, the wiring board 10 closely contacts the brackets 81 shown in FIG. 9 and the lower surfaces of the setting plates 99, so that the vertical positioning of the wiring board 10 is completed. In this operation, the peripheral portion of the wiring board 10 is set to the same height, and the surfaces of the wiring board 10 are pressed by the brackets 81 and setting plates 99. Consequently, the surfaces of the wiring board are stretched therealong due to the pressures from the brackets 81 and setting plates 99, so that the warp in the wiring board 10 is removed. Even if the thickness of the wiring board 10 varies, the upper surface thereof is always positioned in the same vertical level.

As shown in FIGS. 10 and 11, the absorber means C is provided above the base member 69. A base plate 104 supporting the absorber means C thereon is joined to three shafts 106, which are slidably passed through the base member 69 and three bearings 105 fixed to the frame 65, and a rod 108 in a cylinder 107 supported on the base member 69. The base plate 104 is reciprocated by an operation of the cylinder 107. Each of the shafts 106 is provided with a smaller-diameter portion at its lower end portion, around which a collar 109 is fitted, and around which a spring 110 is provided slidably, the spring 110 being supported on a member 111. Therefore, even when the base plate 104 is moved up at a high speed by an operation of the cylinder 107, each collar 109 engages with the lower end of the corresponding bearing 105, so that the upwardly-moving speed of the base plate 104 decreases owing to the pressure-resisting force of the spring 110. These springs 110 and springs 115, which will be described later, constitute the shock abosrobing means described above. As shown in FIG. 10, nuts 114 are screwed on the lower end portions of six shafts 113, which are passed slidably through six bearings 112 fixed to the base plate 104, so that the nuts serve as parts for preventing the falling of the shafts 113. Springs 115 are provided on the shafts 113, and a plate 116, formed of a non-magnetic material, is attached to the upper ends of the springs 115. A plate 117, formed of a magnetic material is fixed on the plate 116, and a magnet 118 is bonded to the upper surface of the plate 117. Accordingly, when the cylinder 107 is actuated to lift the base member 104 and bring the magnet 118 into contact with the lower surface of the wiring board 10, so that the pressing force from the magnet 118 against the wiring board 10 becomes large, the springs 115 contract to lessen the pressing force of the magnet 118, i.e., prevent the wiring board 10 from being pressed by an unnecessarily large force. When the magnet 118 is brought close to the wiring board 10, the former attracts, by magnetic force, a lead of a part mounted on the wiring board 10, to cause the lead to contact the solder on the wiring board 10.

As will be described more fully hereinbelow, when the magnet in the absorber means contacts the lower surface of the wiring board, the force, which is based on the attractive force of the magnet, for stretching the wiring board in the direction of the surfaces thereof is applied to the wiring board substantially in the same manner as in the case where the inclination of the wiring board is corrected, to thereby remove the warp in the wiring board.

As shown in FIGS. 2 and 3, a pair of rails 123, extending in the transfer direction of the wiring board 10 and in parallel with each other, are firmly disposed on the base 21, and a frame 128 is supported between the rails 123 so that the frame 128 can be moved in the wiring board-transferring direction 101. A pair of bearings 129 are mounted in an opposed state on the frame 128, and a feed screw 130 is provided between these bearings 129 in such a manner that the feed screw 130 extends at right angles to the wiring board-transferring direction 101. A slider 133 is engaged with the feed screw 130 so as to be screw-fed therealong. A carriage 134 is supported on the slider 133 so that the carriage can be moved up and down.

Figure 15:
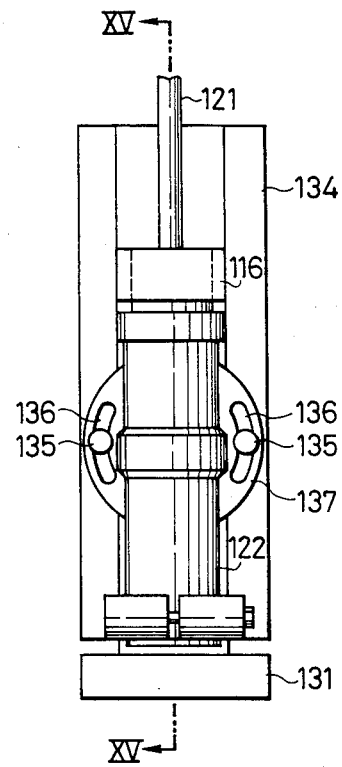
FIG. 15 is a front elevation of the surroundings of an optical system in a heating means constructed in accordance with the present invention.
Figure 16:
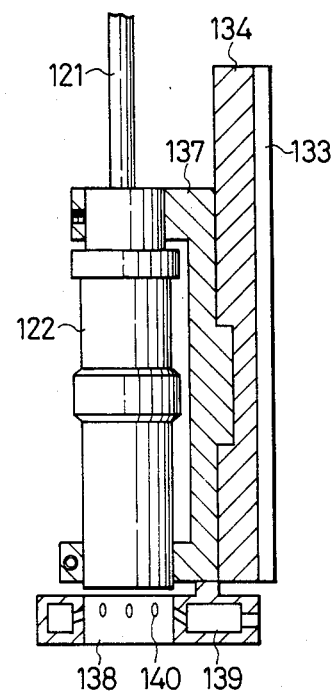
FIG. 16 is a sectional view taken along the line XV—XV in FIG. 15.
Figure 17:
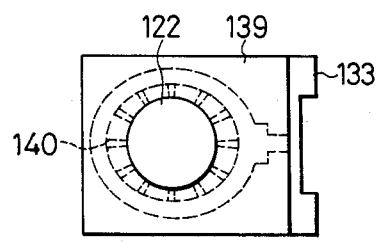
FIG. 17 is a bottom view of the surroundings of an optical system in a heating means FIG. 22.

As shown in FIGS. 15, 16, a rotary base 137 is rotatably supported on the carriage 134 and fixed thereto by screws 135 which are fitted in elongated bores 136 formed in the rotary base 137. An optical fiber 121 is connected at its one end to an optical system 122. As shown in FIG. 17, an open position 138 of an annular nozzle 139 is disposed opposite the lower end surface of the optical system 122, and nozzle bores 140 are communciated with a compressed air supply soruce (not shown).

As shown in FIGS. 2 and 3, the other end portion of the optical fiber 121 is coiled and connected to a laser oscillator 120 fixed to the base 21. The feed screw 130 is connected to a motor 132, which is fixed to a retainer 131 mounted on the frame 128. A feed screw 125 engaged with a nut (not shown), which is fixed to the frame 128, is supported on retainers 124, 126 which are provided on the rail 123, a motor 127 being connected to the feed screw 125.

Due to the above arrangement, the slider 133 is moved in the direction in which the wiring board 10 is transferred, by an operation of the motor 127, and in the direction which is at right angles to the transfer direction 101, by the motor 132. The optical system 122 can be positioned accurately with respect to the wiring board 10, and transferred to the position of an arbitrary lead of an electronic part, by a vertical movement of the carriage 134 and a regulating pivotal movement of the rotary base 137.

The vapor of flux, which occurs while the solder is heated, is blown by the compressed air ejected from the nozzle 139, so that the vapor is not deposited on the optical system 122.

In the above arrangement, solder is applied to a predetermined portion of the wiring board 10 in advance, and a part is mounted on the wiring board so that a lead thereof is positioned on the solder. The resultant wiring board 10 is placed on the rails 23 in the transfer means A.

Figure 18A:
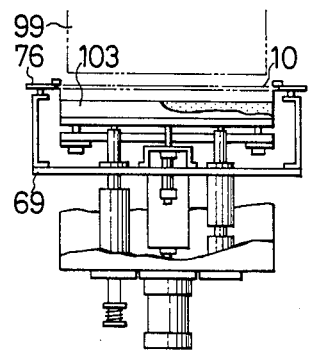
FIGS. 18a, 18b, 18c and 18d illustrate the steps of an operation of the apparatus of the present invention.
Figure 18B:
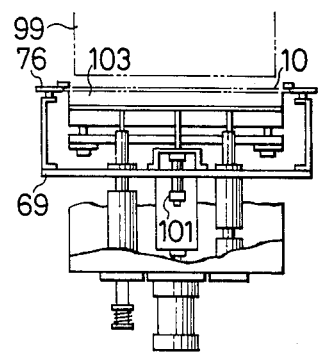
Figure 18C:
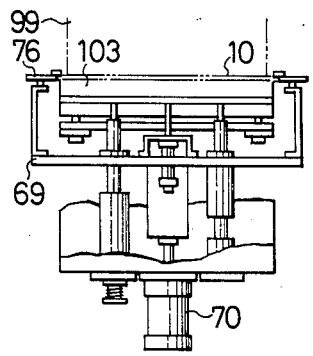
Figure 18D:
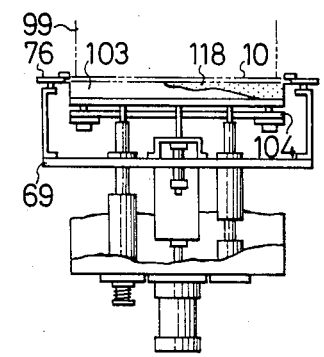
Figure 19:
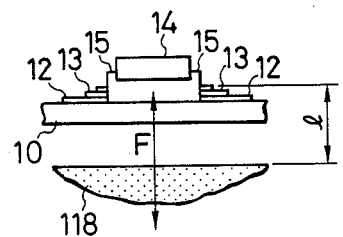
FIG. 19 illustrates a relationship between an electronic part and a magnet in accordance with the present invention.
Figure 20:
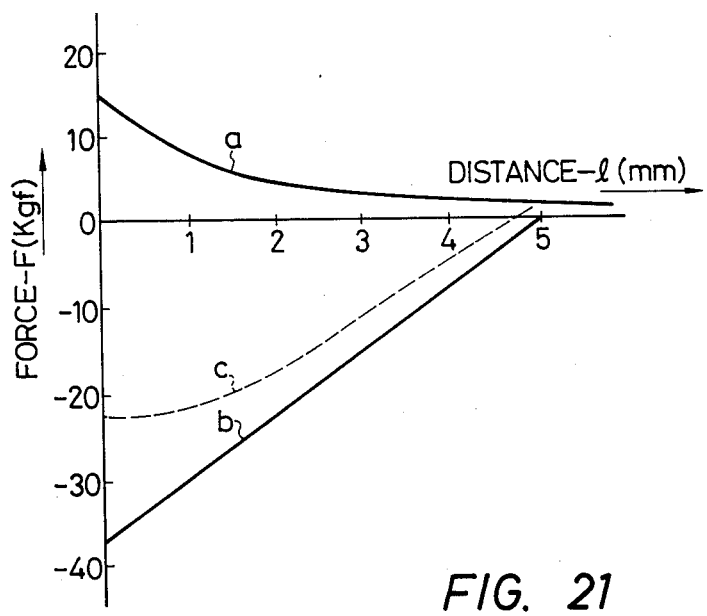
FIG. 20 is a graphical illustration of a relationship between the lifting force of the magnet and the pressureresistance of a spring according to the invention.
Figure 21:
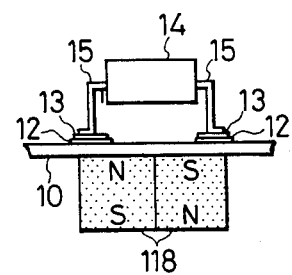
FIG. 21 illustrates a relationship between the electronic part and the arrangement of magnets.

When the cylinders 39 are actuated, the claws 33 move up to positions opposite to end surfaces of the wiring board 10. The motor 62 is then rotated to move the sliders 31 and press the wiring board 10 by the claws 33. Thus, the wiring board 10 is sent from a feed position on the rails 23 to a position thereon in which the rails 76 are connected to the rails 23. When the sliders 31 have reached the terminal positions of th movement thereof, the motor 62 is stopped, and the cylinders 39 are actuated to lower the claws 33 from the lower surface of the wiring board 10. The motor 62 is then reversed to return the claws 33 to their original positions. In the meantime, in the position in which the rails 76 are connected to the rails 23, the cylinders 85, 91 in the positioning unit B are actuated to lower the positioning pins 88, 98 and fit them in the reference bores 11a, 11b in the wiring board 10. As a result, the wiring board is horizontally positioned as shown in FIG. 18a. The cylinder 101 is then actuated to move up the lift members 103 and bring the same into contact with the lower surface of the wiring board 10 as shown in FIG. 18b. The cylinder 70 is then actuated to raise the base member 69 as shown in FIG. 18c. Consequently, the bores 79 in the rails 76 engage with the pins 82 as the base member 69 moves up, to horizontally position the rails 76. The wiring board 10 supported on the rails 76 then contacts the brackets 81 and setting plates 99, so that the wiring board 10 is vertically positioned. At this time, the wiring board 10 is clamped by the setting plates 99 and lift member 103, and, therefore, the warp therein is removed. When the cylinder 107 in the absorber means C is then actuated to lift the base member 104, the magnet 118 moves up as shown in FIG. 18d. When the magnet 118 comes close to the wiring board 10, the magnetic force of the magnet 118 works on a lead of the electronic part 14, which is mounted on the wiring board 10, to attract the same. When leads 15 of the electronic part 14 exist above the solder, which is printed on the wiring patterns 12 on the wiring board 10, at this time as shown in FIG. 19, these leads 15 are brought into press-contact with the solder 13 due to the attractive force of the magnet 118. The attractive force working on the leads 15 is in inverse proportion to a square of a distance between the magnet 118 and leads 15. This attractive force also works as the force for pressing the leads 15 against the solder 13, and as the force for lifting the magnet 118. When the magnet 118 comes close to the wiring board 10, the collars fitted around the shafts 106 engage the lower ends of the bearings 105. When the magnet 118 further moves up, the springs 110 shown in FIG. 10 and provided on the shafts 106 contract. Consequently, the force for lifting the magnet 118 is offset by the pressure resisting force of the springs 110, and the speed of the upward movement, which is made by the cylinder 107 shown in FIG. 10, of the magnet 118 decreases. Namely, as shown in FIGS. 19 and 20, the attractive force (drawing force) $\underline{a}$ working on the magnet 118 is offset by the pressure resisting force (force for lowering the magnet 118) $\underline{b}$ of the springs 110, and the combined force $\underline{c}$ works in the direction in which the magnet 118 is lowered. Accordingly, the speed of the upward movement, which is made by the cylinder 107, of the magnet 118 decreases by an amount corresponding to the combined force $\underline{c}$, so that the impact of the magnet 118 upon the wiring board 10 can be lessened. The impact of the magnet 118 upon the wiring board 10 is also absorbed by the springs 115 provided between the base plate 104 and plate 116. Therefore, the magnet 118 does not impinge upon the wiring board 10, and electronic the parts 14 mounted on the wiring board 10, are not moved. When magnets 118 are disposed so that two magnetic poles N and S are positioned under one part 14 so as to form a magnetic circuit through the leads 15 of the part 14 as shown in FIG. 21, the leads 15 can be more reliably attracted.

Figure 23:
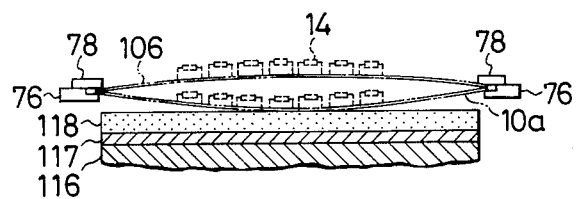
FIG. 23 illustrates a relationship between the warp in the wiring board and the magnet.

When the setting plates 99 are not employed, the above magnet can also serve as an effective wiring board-correcting means. Namely, when the central portion of the wiring board 10 is bent downward as shown at 10a in FIG. 23, the bent portion 10a is raised by the upper surface of the flat magnet 118, and flattened. Conversely, when the magnet 118 is bent 10b upward, the bent portion is flattened by the attractive force of the magnet 118. Accordingly, the warp in the wiring board 10 is removed.

When the wiring board 10 has been positioned and flattened as mentioned above, the cylinder 70 is actuated to cause the base member 69 to move up. Consequently, the rails 76 are horizontally positioned, and the upper surface of the wiring board 10 engages with the brackets 81 to be set in predetermined vertical position.

The laser oscillator 120 in the heating means D is then actuated to emit a laser beam therefrom, and the motors 127, 132 are rotated to move the optical system 122 along a predetermind path. The laser beam radiated from the optical system 112 is applied to a parts-connecting portions of the wiring board 10 to melt the solder 13 and thereby connect the wiring patterns 12 on the wiring board 10 and the leads 15 of the electronic parts 14 together. If the distance h between this optical system 122 and the wiring board 10 is set so that a laser beam 140 from the optical system 122 is applied to the wiring board 10 after the laser beam 140 has passed a focus f of the optical system 122, a stable part-connecting operation can be carried out without accompanying the burning of the wiring board 10 even when the distance h varies due to the vibrations of the apparatus as a whole. When the connecting of all parts on the wiring board 10 has been completed, the laser oscillator 120 stops emitting the laser beam, so that the optical system 122 returns to its original position and as a result, the motors 127, 132 stop rotating. The cylinder 107 in the absorber means C is then actuated to lower the magnet 118 as shown in FIG. 18c. During this time, the wiring board 10 is supported on the lift members 103, setting plates 99 and rails 76. The cylinder 70 is then actuated to lower the base member 69 as shown in FIG. 18b. Consequently, the height of the rails 76 becomes equal to that of the rails 23, 24. The cylinders 101 are then actuated to lower the lift members 103 as shown in FIG. 18a. When at the same time the cylinders 85, 91 are actuated to disengage the positioning pin 88, 98 from the wiring board 10, the wiring board 10 is ready to be transferred. The wiring board 10 transferred to a recovery position on the rail 24 is removed therefrom and delivered to a subsequent stage. Thus, the wiring patterns on the wiring board 10 and the leads of an electronic part can be connected together.

According to this embodiment, the solder on the wiring board and the leads of an electronic part 14 are connected in a press-contacting state, and therefore, insufficiently-connected leads do not occur. Since the warp in the wiring board 10 can be removed, the distance between the optical system and the wiring board 10 becomes constant. This enables a part-connecting operation to be carried out under stable conditions. In addition, the positioning of the wiring board 10 in the vertical direction is accomplished with respect to the upper surface thereof. Therefore, this positioning operation is not influenced by the variations in the thickness of the wiring board 10.

As may be clear from the above description, the present invention enables a reliable and highly accurate lead-soldering operation, an improvement of the reliability and yield of products, and a provision of an automatic, unattended part-connecting apparatus using solder.

The magnet used in the present invention may also consist of an electromagnet as in the above embodiment. Especially, when a permanent magnet is used, it may have small dimensions to obtain a predetermined level of magnetic force. This enables a remarkable effect to be obtained in connecting with solder the circuit elements having a high density of integration.

What is claimed is:

1. A parts-connecting apparatus using solder, wherein solder is provided between wiring patterns on a wiring board and leads of a part to be mounted thereon to connect said wiring patterns and said leads together via said solder, the apparatus comprising a positioning means for setting said wiring board in a predetermined position, an attractor means for fastening said leads to predetermined portions of the wiring patterns on said wiring board including a permanent magnet disposed opposite one surface of said wiring board, means for adjustably mounting said permanent magnet at a distance from said surface of said wiring board, buffer means for decreasing a speed of upward movement produced by said permanent magnet as a distance between the permanent magnet and the surface of the wiring board is decreased, heating means including means disposed above the wiring board for heating the leads of the part, and means for movably mounting said heating means so as to enable the same to heat said leads of said part and thermally melt said solder.

2. A parts-connecting apparatus according to claim 1, wherein said positioning means includes means for positioning said wiring board in the horizontal direction, means for positioning said wiring board in the vertical direction 3. A parts-connecting apparatus using solder according to claim 1, wherein said heating means includes an optical system disposed above said wiring board and adapted to be moved to and heat the leads of said part, a radiation beam being applied from said optical system to solder-connecting portions provided between said leads and the wiring patterns on said wiring board, so as to heat the same.

4. A parts-connecting apparatus according to claim 1, wherein said buffer means includes a spring means arranged on a movable member cooperable with said permanent magnet for producing a pressure resisting force as the distance between said permanent magnet and said wiring board is decreased.

5. A parts-connecting apparatus using solder, wherein solder is provided between wiring patterns on a wiring board and leads of a part to be mounted thereon to connect said wiring patterns and said leads together via said solder, the apparatus comprising a positioning means for setting said wiring board in a predetermined position, attractor means for fastening said leads to predetermined portions of the wiring patterns on said wiring board by adjustably closing a distance between a permanent magnet and a lower surface of said wiring board, buffer means for decreasing a speed of upward movement produced by said permanent magnet as said permanent magnet closes a distance between the permanent magnet and said wiring board, heating means including an optical system disposed above said wiring board and adapted to be moved to and heat the leads of said part, a radiation beam being applied from said optical system to solder-connecting portions, which are provided between said leads and the wiring patterns on said wiring board, so as to heat the same, and a blowing means for blowing a vapor of flux occurring around the output portion of said radiation beam applied from said optical system.

* * * * *